United States Patent [19]
Jesser et al.

[11] Patent Number: 5,145,712
[45] Date of Patent: Sep. 8, 1992

[54] CHEMICAL DEPOSITION OF DIAMOND

[75] Inventors: William A. Jesser, Charlottesville; Fred P. Doty, Albemarle County, both of Va.

[73] Assignee: Center for Innovative Technology, Herndon, Va.

[21] Appl. No.: 652,106

[22] Filed: Feb. 8, 1991

[51] Int. Cl.⁵ .................. B05D 3/06; C23C 16/26
[52] U.S. Cl. .................. 427/38; 427/249; 427/50; 427/314; 427/122; 427/49; 428/408
[58] Field of Search .................. 427/38, 249, 49, 50, 427/314, 122, 255.1; 428/408; 423/446

[56] References Cited

U.S. PATENT DOCUMENTS

| | | | |
|---|---|---|---|
| 3,317,354 | 5/1967 | Darrow et al. | 148/1.5 |
| 3,630,678 | 12/1971 | Gardner | 423/446 |
| 3,961,103 | 6/1976 | Aisenberg | 427/39 |
| 4,191,735 | 3/1980 | Nelson et al. | 423/446 |
| 4,740,263 | 4/1988 | Imai et al. | 156/613 |
| 4,919,974 | 4/1990 | McCune et al. | 427/249 |
| 4,940,015 | 7/1990 | Kobashi et al. | 118/723 |
| 4,953,499 | 9/1990 | Anthony et al. | 118/724 |
| 4,958,592 | 9/1990 | Anthony et al. | 118/724 |
| 4,961,958 | 10/1990 | Desphandey et al. | 427/38 |
| 4,970,986 | 11/1990 | Anthony et al. | 118/724 |
| 5,068,871 | 11/1991 | Uchida et al. | 373/17 |

FOREIGN PATENT DOCUMENTS 63-159292 7/1988 Japan .

Primary Examiner—Shrive Beck
Assistant Examiner—Roy V. King
Attorney, Agent, or Firm—Whitham & Marhoefer

[57] ABSTRACT

A method and apparatus for depositing patterned diamond including a container having a chamber sealed sufficiently to be evacuated to a low pressure, a support positioned in the said container, a grid extending within the container to divide it into a first chamber region and a second chamber region, a grid bias supply for creating an electric charge on the grid, a gas including a plurality of carbon-containing molecules and positioned within the first chamber region, a filament positioned within the first chamber region, a filament heater for heating the filament to a temperature sufficient to dissociate at least some of the carbon-containing molecules into a plurality of ions, a filament bias supply for creating an electric charge on the filament, a substrate on which diamond crystals can grow positioned in the second chamber region, a substrate bias supply for creating an electric charge on the substrate, and a substrate heater for heating the substrate to a temperature sufficient for the formation of diamond crystals. In one aspect of the invention, the filament bias is maintained at a negative charge, the grid bias is maintained at a positive charge and the substrate bias is maintained at a positive charge greater than the grid bias.

23 Claims, 2 Drawing Sheets

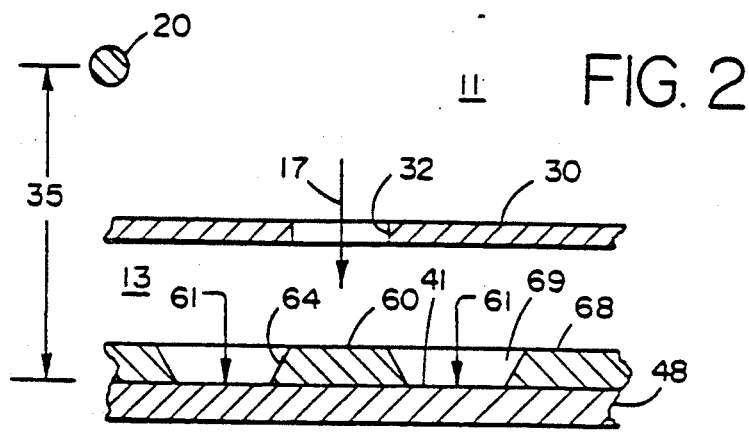
FIG. 2
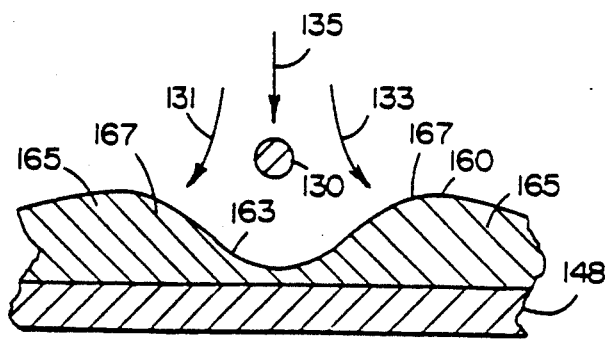
FIG. 3
FIG. 4
(PRIOR ART)
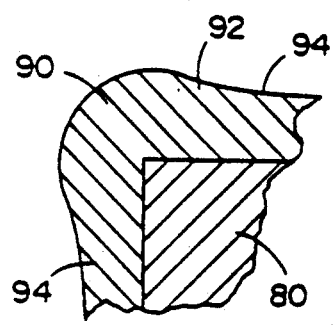
FIG. 5
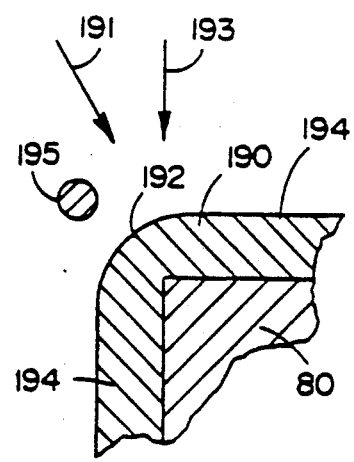

CHEMICAL DEPOSITION OF DIAMOND

BACKGROUND OF THE INVENTION

The present invention relates to the manufacture of diamond material and more particularly to chemical vapor deposition of diamond and diamond films.

Low pressure chemical vapor deposition (CVD) of diamond is an emerging technology with numerous potential applications. Serious efforts have been made to understand the mechanism for diamond formation under CVD conditions. A number of observations on the conditions favoring growth have been reported and mechanisms for the growth have been proposed. Prior known methods of diamond CVD employ a means of forming free radicals in a precursor gas, and it has been proposed that a key aspect of diamond CVD is the removal of non-diamond carbon by atomic hydrogen.

Free radicals are also believed to participate in the mechanism for diamond formation. By one proposed mechanism abstraction of a hydrogen creates a radical site on the growth surface. The growth is thought to proceed by addition of acetylene molecules. This proposed mechanism relies entirely on neutral species to initiate and propagate the growth.

An alternative proposed mechanism relies on a positive methyl ion to initiate the reaction. Growth of the diamond can then proceed with the addition of methyl radicals, as long as a positive charge is maintained on the substrate surface. This may provide an explanation for the observed effect of substrate potential on growth rate.

At least one researcher has reported evidence that negative ions can promote the formation of diamond. Pulsed plasma diamond crystallization experiments showed that diamond and graphite contents of the films varied with position of the substrate in the apparatus. Analysis of the chemical content of the plasma indicated that C=C molecules favor the formation of graphite, while $C^-$ ions were found where diamond formation was favored.

Japan Patent No. 63159292 illustrates the use of a high temperature mesh apparatus for exiting at high voltages the raw gas material in a large space. U.S. Pat. No. 3,961,103 shows a method and apparatus for depositing a thin film of material upon a base substrate including a glow discharge ion source.

The known processes for deposition suffer a number of disadvantages including the inability to create coating on selected areas of a substrate. During the use of electronic devices, heat is generated that must be dispersed. Diamond is both an electrical insulator and semiconductor and a heat conductor that would be useful in electronic devices if the diamond could be deposited in selected areas in appropriate patterns on the device. Moreover, in the coating of cutting tools, increased coating film thickness sometimes occurs at the corners or edges of the cutting tool. These thickened or bulb regions of the coating may be structurally weaker than the thinner regions of the coating. Moreover, the formation of the bulb may cause undesirable dimensional inaccuracies in the cutting tool and in the workpiece cut using the cutting tool.

SUMMARY OF THE INVENTION

The disadvantages of the prior art are alleviated to a great extent by the present invention which provides a method and apparatus including a method for the chemical vapor deposition of diamond on a substrate comprising the steps of supplying hydrogen atoms and carbon-containing species in an electric field positively biased towards the substrate in a low pressure atmosphere with the substrate having a temperature suitable for chemical vapor deposition. In one aspect, the method includes the step of using an electrically charged grid to direct the propagation of the negative species to selected regions of the substrate. In another aspect of the invention, the method includes the step of maintaining the pressure and voltages to suppress thermionic emission discharge to the substrate. In another aspect, the carbon-containing species are formed by introducing a gas having a plurality of carbon containing molecules to a first chamber region on one side of said grid to contact a filament heated to a dissociation temperature sufficient to dissociate at least some of said carbon-containing molecules into a plurality of activated species.

The apparatus includes a container having a chamber sealed sufficiently to be evacuated to a sub-atmospheric pressure, a support positioned within the container, a grid extending within the container to divide it into a first chamber region and a second chamber region, a grid bias supply for creating an electric charge on the grid, a source of activated chemical species to the first chamber region, a counter electrode positioned within the first chamber region, a counter electrode bias supply for creating an electric charge on the counter electrode, a substrate on which diamond crystals can grow and positioned in the second chamber region, a substrate bias supply for creating an electric charge on the substrate, and a substrate heater for heating the substrate to a temperature sufficient for the formation of diamond crystals.

In one aspect of the invention the source of activated chemical species includes a filament and source of a gas including a plurality of carbon-containing molecules to contact the filament and a filament heater for heating the filament to a temperature sufficient to dissociate at least some of the carbon containing molecules into a plurality of activated species.

In another aspect of the invention the filament functions as the counter electrode.

In one aspect of the invention the counter electrode bias, the grid bias and the substrate bias are independently controlled. The counter electrode bias is maintained at a negative electric potential, the grid bias is maintained at a positive electric potential and the substrate bias is maintained at a positive electric potential greater than the grid bias.

In another aspect of the invention the grid has an aperture through which activated species can pass to be deposited on the substrate to form diamond in a predetermined area proximate the aperture. In creating a pattern, such as an electronic device, the aperture or apertures, may be configured in desired patterns to selectively deposit diamond in corresponding patterns. In another aspect of the invention the grid includes a rod which suppresses the formation of diamond on areas of the substrate proximate the rod. The rod is positioned at selected regions of the substrate on which diamond deposition is to be suppressed. In coating a cutting tool the wire may be located in the region of the corner of the cutting tool to suppress the formation of a thickened film or bulb at the corner.

This method and apparatus provides the activated chemical species in the gas, and does not have the complicating factors of high frequency alternatinq fields, high energy electrons and ions, unknown (floating) substrate potential or high electron temperatures associated with other techniques. Since hot filament chemical vapor deposition (HFCVD) produces only pyrolysis products, thermal electrons, and a small number of ions, simple DC experiments can be designed to provide relatively unambiguous information about the nature of the growth process.

It is the object of the present invention to provide a method and apparatus for the deposition of diamond on a substrate.

It is another object of the present invention to provide a method and apparatus for the deposition of diamond in a controlled manner.

It is a further object of the present invention to provide a method and apparatus for the deposition of diamond on a substrate with the foregoing advantages and in which the rate of deposition can be controlled.

It is yet another object of the present invention to provide a method and apparatus for the deposition of diamond on a substrate in which the uniformity of thickness of the coating can be controlled.

It is still another object of the present invention to provide a method and apparatus for the deposition of diamond on a substrate in which the deposition pattern of the coating can be controlled.

It is still a further object of the present invention to provide a method and apparatus for the deposition of diamond on a substrate in which the deposition of the coating can be suppressed in selected areas.

It is another object of the present invention to provide a method and apparatus for the deposition of diamond on a substrate with the foregoing advantages and in which the deposition of coating is selectively controlled in the manufacture of an electronic device.

It is another object of the present invention to provide a method and apparatus for the deposition of diamond on a substrate with the foregoing advantages and in which the deposition of coating is selectively controlled on a cutting tool.

Other objects and advantages of the present invention will become readily apparent from the following description and drawings which illustrate preferred embodiments of the present invention.

BRIEF DESCRIPTION OF THE DRAWINGS

FIG. 2 is a schematic view of the filament, grid and substrate of the apparatus of FIG. 1.

FIG. 3 is a schematic view showing deposition using a rod according to the present invention.

FIG. 4 is a schematic view of a coating deposit on a cutting tool edge using a prior art coating system.

FIG. 5 is a schematic view of a geometry for depositing onto a cutting tool edge according to the present invention.

DETAILED DESCRIPTION OF PREFERRED EMBODIMENT

Figure 1:
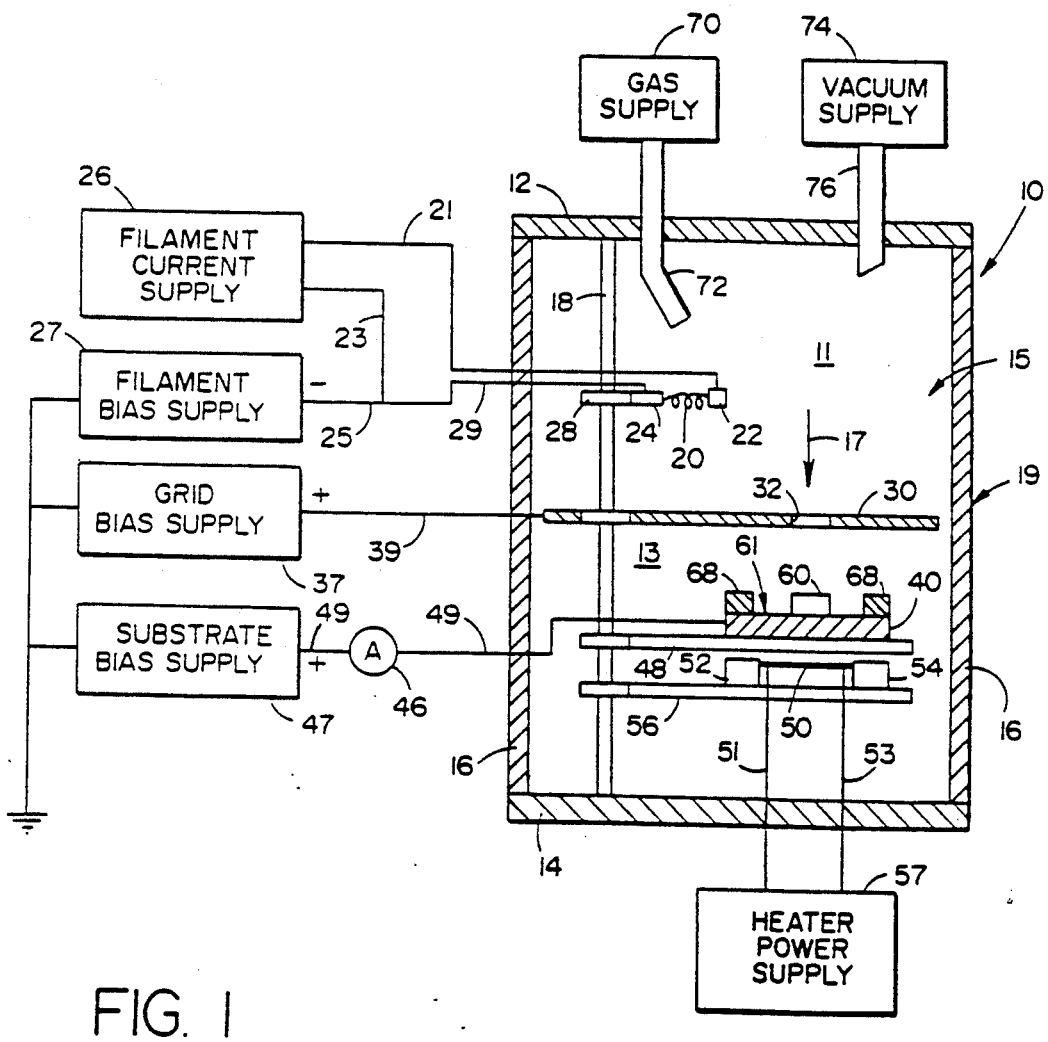
FIG. 1 is a schematic side view of a deposition apparatus according to the present invention.

Refer now to FIG. 1 there being shown an apparatus, generally designated by reference numeral 10, for the deposition of diamond according to the present invention. The deposition apparatus 10 includes a deposition chamber 19 having a circular steel plate first container end 12 and a circular steel plate second container end 14 which attached to the ends of a hollow cylindrical glass container wall 16. The container wall 16 should preferably be composed of an electrically insulating material. The container wall 16 and the container ends 12 and 14 form a deposition chamber 15. The seals between the container wall 16 and the container ends 12 and 14, as well as the seals of any conduits or wires protruding through the container walls or ends, should be sufficient so that a sufficiently low pressure which is required for the diamond formation process of the present invention can be maintained.

A support rod 18 is attached to and extends between the container ends 12 and 14 within the deposition chamber 15 and various components of the deposition apparatus 10 are attached to the support rod 18. Alternatively, other support apparatus that can maintain the desired spacial relationship of the components of the deposition apparatus 10 may be used.

A filament 20 is mounted between a first filament holder 22 and a second filament holder 24 which are both attached to the support rod by filament support 28. In the preferred embodiment the filament 20 serves two functions. First, the filament 20 acts as a counter electrode and is electrically charged to, with other electrically charged components of the apparatus 10, create an electrical field within the chamber 15. Second, the filament 20 provides a source of heat for the creation of activated chemical species. Alternatively, a filament or non-filament counter electrode could be used which could be heated by means other than electric current. Additionally, a separate source of activated chemical species could be employed such that the counter electrode could be used merely in the generation of the electric field. Such separate source of activated species could include direct current plasma processes, microwave plasma generators, glow discharge processes, or a separate source of heat, which could be, for example, a separate filament. Moreover, additional and/or other electrodes and sources of activated species may be employed. The specific composition of the activated chemical species that results is not determined, however, it may include all or any combination of ions, radicals, molecules, atoms, electrons and/or radical ions.

The filament is to be heated to a temperature of approximately twenty-four hundred degrees Kelvin for the dissociation of a gas into activated chemical species used in the deposition process. Such temperature is generally where maximum growth of diamond crystals has been observed. Other temperatures may be used. About seventeen hundred degrees Celcius is generally considered to be a minimum temperature for dissociation of hydrogen. In the embodiment of FIG. 1, tungsten is used for the filament although other filament materials may be used. In the preferred embodiment the filament 20 is heated by passing an electric current through it. The electric current is provided by a filament current supply 26 connected to the filament 20 by electrical conductors. In FIG. 1, electrical conductors and electrical components are shown schematically. The filament current supply 26 is connected to the filament 20 by a first filament current conductor 21 and a second filament current conductor 23 which joins to a filament current/bias conductor 29. The electrical conductors from the filament current supply can be connected directly to the filament 20 or may pass through the first filament holder 22 and the second filament holder 24. Preferably, all of the electrical conductors and connections of the apparatus 10 are insulated from the support rod 18 and the container 19. The filament current supply may generate direct or alternating current sufficient for generating enough heat in the filament 20, due to its electrical resistivity, to reach a temperature sufficient to dissociate the gas into activated species needed for the deposition process. A filament bias supply 27 is provided to electrically charge the filament 20. The filament bias supply is electrically connected to the filament 20 through a filament bias conductor 25 and the filament current bias conductor 29.

A grid 30 extends within the deposition chamber 15 to divide the deposition chamber 15 into a first chamber region 11 and a second chamber region 13. There may be some connection between the chamber regions 11 and 13 around the edges of the grid 30 or grid 30 may extend all the way to the container wall 16. The grid 30 is electrically insulated from the support rod 18. A grid bias supply 37 is provided to electrically charge the grid 30. The grid bias supply 37 is electrically connected to the grid 30 by a grid bias conductor 39. An aperture 32 is formed in the grid plate 30 so that charged species can pass from the first chamber region 11 into the second chamber region 13 to be deposited on the substrate 40 for making diamond. The substrate 40 is supported by a substrate support 48 which is connected to the support rod 18.

A substrate bias supply 47 is provided to electrically charge the substrate 40. The substrate bias supply 47 is electrically connected to the substrate 40 through a substrate bias conductor 49. An ammeter 46 is placed in series with the substrate bias conductor 49 for monitoring any electrical current through the substrate bias conductor 49 as discussed further below.

A substrate heater 50 is provided for maintaining the substrate 40 at a temperature conducive to the formation of diamond. In the preferred embodiment, the heater is a molybdenum resistor heater ribbon through which an electric current is passed. Other materials and/or heaters may be used. The heater 50 is supported between a first heater holder 52 and a second heater holder 54 which are supported by a heater support 56 which is attached to the support rod 18. A heater power supply 57 is provided to supply electric current through the heater 50. The heater power supply 57 is connected through the heater 50 through a first heater conductor 51 and a second heater conductor 53.

A vacuum supply 74 is provided to maintain the pressure in the deposition chamber 15 at a low pressure of less than atmospheric pressure as discussed further below. The vacuum supply 74 is in fluid communication with the deposition chamber 15 by way of a vacuum conduit 76. A gas supply 70 provides a precursor gas to the first chamber region 11 by way of a gas conduit 72. The gas conduit 72 may be oriented to direct gas flow over the filament 20. As discussed below, in a preferred embodiment, the source gas is hydrogen and methane although other gases may be used. Each of the filament current supply 26, the filament (counter electrode) bias supply 27, the grid bias supply 37, the substrate bias supply 47, the heater power supply 57, the gas supply 70 and the vacuum supply 74 are independently controllable. In FIG. 1, the filament bias supply is illustrated as creating a negative charge on the counter electrode filament 20, the grid bias supply is shown as creating a positive charge on the grid plate 30 and the substrate bias supply is shown as inducing a positive charge on substrate 40, however, other combinations of polarities may be utilized as described below.

The activated species are created by the dissociation of the hydrogen and methane gas supplied via the gas conduit 72 into neutral, positive and negative species by the heat of filament 20. Because the chamber 15 is not evacuated, but merely maintained at a low pressure, preferably below about thirty torr, the ions migrate or diffuse through the atmosphere of the chamber aided by the propulsion effects of the electric field. The activated species pass through the aperture 32 in the direction of the arrow 17 and are deposited onto the heated substrate 40, whereupon a chemical growth of diamond crystals results in a mesa-like deposit of diamond coating 60 proximate the aperture 32. Carbonaceous material 68 grows away from the diamond 60 in regions where the hydrogen radicals have been depleted. There is no growth of diamond or graphite in the substrate area 61 where charged species do not reach the substrate due to the electrical field created by the grid 30, but hydrogen radicals do reach the substrate, their transport being unaffected by the field.

The apparatus 10 is a hot filament assisted chemical vapor deposition system with the grid 30 placed between the counter electrode filament 20 and the substrate 40, so that the potential on the substrate 40 and the current between the filament 20 and the substrate 40 can be independently controlled. The current-voltage characteristics of the system are similar in some respects to those of a vacuum tube triode, with the substrate acting as the anode. In the embodiment of FIGS. 1 and 2, the separate power supplies 27, 37 and 47 are direct current type and control the potentials of the cathode or filament 20, the grid 30, and the plate or substrate 40. Although only one counter electrode filament 20 is used in the preferred embodiment multiple counter electrodes could be used.

Refer now to FIG. 2 there being shown a close up schematic view of the geometry of certain components of the deposition apparatus 10. The grid 30 is a sheet of molybdenum foil spanning almost the entire diameter of the container 19. The aperture 32 is round hole having a diameter of approximately two millimeters. The filament 20 is placed off center, so that direct radiation from the filament 20 does not radiate through the aperture 32 to fall on the growth region of the substrate 40. Thus, there is no photon or molecular beam between the filament 20 and the substrate 40 created in the apparatus 10 or involved in the diamond deposition process. The filament-to-substrate spacing 35 is approximately one centimeter, and the aperture 32 is placed approximately half way in between Other spacings and geometries may be used for various conditions. Species created at the filament 20 must diffuse laterally and down with respect to FIG. 2 through the region 11 and the aperture 32 to participate in the growth reaction on the substrate surface 41.

The supplies 26, 27, 37, 47, 50, 70 and 74 are maintained to avoid striking a direct current plasma in chamber 15. Although plasma may actually exist in the chamber 15, reference herein to a plasma means the kind of plasma which will support thermionic emission discharge propagation. With a pressure of about twenty-six torr, it is possible to strike a plasma with as little as about seventy volts potential difference between nearby points in the system. Once a plasma is struck, large electric currents occur which may continue even if the voltages are then reduced. The ammeter 46 is used to monitor the electric current through the substrate 40 to insure that plasma conditions are avoided.

The relatively small size of the aperture 32 allows the conductance therethrough of relatively few charged species and thus the magnitude of the plate current detected by the ammeter 46 should be relatively small. With the grid 30 removed, plate currents on the order of milliamperes may exist. With the grid 30 in place, and with the ratio of the aperture 32 area to the total grid 30 area at about $2.5 \times 10^{-3}$, plate currents are reduced to the microampere range. The entire apparatus 10 or the container 19 may be placed inside a grounded steel hood (not shown) to exclude extraneous electric fields.

For a given filament 20 potential the plate current will vary as a function of grid 30 potential and the substrate potential For current caused by the transport of negative species the plate current will be zero unless the grid potential is more positive than the filament potential and the substrate potential is more positive than the grid potential. The plate current is due to the transport of electrons and its magnitude is indicative to some extent of the rate of transport of activated species to the substrate. As the grid potential is increased, the plate current reaches a maximum at specific grid potentials that depend on the selected value of the substrate potential. The plate current is zero when the grid potential is either greater than the substrate potential or less than the filament potential. When the substrate potential is greater than the filament potential, electrons from the filament 20 can reach the substrate 40 by transport through the electric field created by the potential of the components of apparatus 10. The rate of transport of electrons and other species is modulated by applying a potential to the grid. If the substrate potential is greater than the grid potential, then current flows. Where the grid potential is outside the range between the filament potential and the substrate potential, the charge carriers encounter a repulsive electric field, and no plate current is observed.

It is important to note that both positive and negative charge carriers emitted from the filament are repelled from the plate or substrate 40 whenever the grid potential is outside of the range between the substrate potential and the filament potential. Thus with the apparatus 10, the transport of charged species may be controlled such that only neutral species reach the substrate 40, or such that neutrals plus negative (if the substrate potential is greater than the filament potential) or neutrals plus positive (if the substrate potential is less than the filament potential) charged species reach the substrate 40 and are available to participate in the diamond growth reaction.

Refer now to FIG. 3 there being shown another embodiment of the invention wherein a grid 130 is a rod rather than a plate with an aperture. The rod 130 is extending into the plane of FIG. 3. In this embodiment, the activated species diffuse in the direction of arrow 135 and are accelerated away from the grid 130 so that the diamond film 160 formed on the substrate 148 in the proximity of the grid 130 is suppressed. Therefore, there is a region 163 of the diamond deposit 160 in the proximity of the grid 130 which is relatively thin with respect to the remote regions 165 of the diamond deposit 160. Due to the deflection of ions from region 130, region 167 directly surrounding the thin region 163 may be relatively thick with respect to the remote regions 165 of the diamond material 160.

Refer now to FIG. 4 which illustrates a cutting tool corner 80 having a hard coating such as diamond 92 applied thereto. In many prior art processes, the hard coating 92 may have a relatively uniform thickness in the regions 94 remote from corners, however, have a relatively thick portion 90 at the location of the corners or edges. This results in a nonuniform thickness of the hard coating 92. The thick region or bulb 90 may be physically weaker than the normal regions 94 and may lead to premature breakdown of the hard coating 92 and dullness of the cutting tool edge 80. In addition, the presence of the bulb 90 may affect the dimensional accuracy of the workpiece being cut by the cutting tool edge 80 and may result in unacceptable dimensions in the workpiece.

Refer now to FIG. 5 wherein the present invention is utilized to form a hard coating at the cutting tool edge 80 which is more uniform in thickness than the coating 92 of FIG. 4. A grid 195 is positioned in the proximity of the cutting tool corner 80 to suppress the growth of the coating as discussed above. The direction of the diffusion of the activated species may be chosen over a range of angles such as, for example, the direction of the arrows 191 and 193 of FIG. 5, or other directions as may be suitable for the particular geometry of the cutting tool edge 80. Due to the effect of the suppression of the coating caused by the presence of the grid 195, the growth of the coating at the corner 192 is suppressed and is closer to or equal to the thickness of the remote regions 194.

In operation of the apparatus 10, the prepared substrate 40 is placed in position with respect to the grid 30 and the aperture 32. The container 19 is closed and the vacuum supply 74 is operated to decrease the pressure in the chamber 15 to a desired pressure, preferably less than about thirty torr. The heater power supply 57 is controlled to heat the ribbon 50 to the desired temperature, preferably about eight hundred degrees Celcius. The filament current supply 26 is controlled to heat the filament to a desired temperature, preferably about twenty four hundred degrees Kelvin. The gas supply 70 is controlled to provide a suitable gas such as hydrogen and methane. The three electrodes, counter electrode filament 20, grid 30 and substrate 40, are electrically charged by the filament bias supply 27, the grid bias supply 37 and the substrate bias supply 47 to create an electric field. The gas is dissociated at the hot filament 20 into activated chemical species that are transported with the aid of the electric field through the aperture 32 to the surface of the heated substrate 40 where diamond crystal formation occurs. The grid 30 may be a single grid or may include a number of grids placed side by side, in a single plane or on different planes. The grids may be planar, rod-like and/or other geometric shapes and combinations thereof. The apertures of the grids may form a desired pattern for coating a substrate. The pattern of apertures and grids may be chosen, for example, to coat a desired pattern of diamond onto an electric device such as, for example, an integrated circuit. The diamond deposit may serve to aid in conducting heat away from the device to a heat sink and may also act as an electrical insulator or semiconductor. The bias of the various grids may be controlled individually to achieve the desired electric field. The supplies may be controlled to increase or decrease the rate of diamond growth by controlling the potential of the various regions of the electric field, by controlling the rate of activated species creation and by controlling the temperature of the substrate.

EXAMPLE 1

A two inch diameter copper disk substrate 40 was scratched with one micrometer diamond paste, then cleaned in hot ethanol prior to placing it in position in the apparatus 10. The heater power supply 57 was adjusted to heat the heater 50 to maintain the temperature of the substrate 40 at approximately eight hundred degrees Celsius. The filament bias supply 27 was adjusted to maintain the filament temperature at approximately twenty-four hundred degrees Kelvin. All temperatures were measured with an optical pyrometer.

The source gas was commercial grade hydrogen containing one percent methane. The gas supply 70 was adjusted to admit the source gas at the rate of approximately sixty sccm (cubic centimeters per minute at standard conditions) into the first chamber 11. The vacuum supply 74 was adjusted to maintain the pressure in the chamber 15 at approximately two to twenty-six torr. The filament bias supply 27 was adjusted to maintain a potential of approximately negative eight volts on the filament 20. The grid bias supply 37 was adjusted to maintain a potential of approximately eight volts on the grid 30. The substrate bias supply 27 was adjusted to maintain a potential of approximately eighteen volts on the substrate 40. The apparatus 10 was run for approximately fourteen hours. A plate current of approximately two hundred and eighty picoamperes was measured by the meter 46. A deposit of translucent diamond crystals 60 was created on the substrate 40 proximate the aperture 32. A deposit of carbonaceous material was created on the substrate 40 in an area spaced from the diamond and the aperture.

EXAMPLE 2

The apparatus 10 was prepared and maintained as set forth in Example 1, except that the grid bias supply 37 was adjusted to maintain the potential of the grid 30 at approximately twenty volts and the substrate bias supply 47 was adjusted to maintain the potential of the substrate 40 at approximately thirty volts. A plate current of greater than one microampere was measured. A deposit of translucent diamond crystals was not created on the substrate 40 proximate the aperture 32. A deposit of carbonaceous material was created on the substrate 40 in an area spaced from the diamond and the aperture.

EXAMPLE 3

The apparatus 10 was prepared and maintained as set forth in Example 1, except that the grid bias supply 37 was adjusted to maintain the potential of the grid 30 at approximately negative five volts. A plate current of approximately 20 picoamperes was measured. A deposit of translucent diamond crystals was created on the substrate 40 proximate the aperture 32. A deposit of carbonaceous material was created on the substrate 40 in an area spaced from the diamond and the aperture.

EXAMPLE 4

The apparatus 10 was prepared and maintained as set forth in Example 1, except that the filament bias supply 27 was adjusted to maintain the potential of the filament 20 at approximately negative thirty-eight volts, the grid bias supply 37 was adjusted to maintain the potential of the grid 30 at approximately negative twenty volts and the substrate bias supply 47 was adjusted to maintain the potential of the substrate 40 at approximately negative five volts. A plate current of greater than one microampere was measured. A deposit of translucent diamond crystals was not created on the substrate 40. A deposit of carbonaceous material was created on the substrate 40 in an area spaced from the aperture.

EXAMPLE 5

The apparatus 10 was prepared and maintained as set forth in Example 1, except that the grid bias supply 37 was adjusted to maintain the potential of the grid 30 at approximately negative eight volts and the substrate bias supply 47 was adjusted to maintain the potential of the substrate 40 at approximately fifteen volts. A plate current of approximately zero was measured. A deposit of translucent diamond crystals was not created on the substrate 40. A deposit of carbonaceous material was created on the substrate 40 in an area spaced from the aperture.

EXAMPLE 6

The apparatus 10 was prepared and maintained as set forth in Example 4, except that the grid bias supply 37 was adjusted to maintain the potential of the grid 30 at approximately negative twelve volts and the substrate bias supply 47 was adjusted to maintain the potential of the substrate 40 at approximately negative two and one half volts. A plate current of approximately two hundred and twenty picoamperes was measured. A deposit of translucent diamond crystals was not created on the substrate 40. A deposit of carbonacecus material was created on the substrate 40 in an area spaced from the aperture.

EXAMPLE 7

The apparatus 10 was prepared and maintained as set forth in Example 4, except that the grid bias supply 37 was adjusted to maintain the potential of the grid 30 at approximately negative fifteen volts and the substrate bias supply 47 was adjusted to maintain the potential of the substrate 40 at approximately zero volts. A plate current of approximately seventy piccamperes was measured. A deposit of translucent diamond crystals was created on the substrate 40 proximate the aperture 32. A deposit of carbonaceous material was created on the substrate 40 in an area spaced from the diamond and the aperture.

EXAMPLE 8

The apparatus 10 was prepared and maintained as set forth in Example 1, except that the grid bias supply 37 was adjusted to maintain the potential of the grid 30 at approximately negative eighteen volts and the substrate bias supply 47 was adjusted to maintain the potential of the substrate 40 at approximately eighteen volts. A plate current of approximately zero was measured. A deposit of translucent diamond crystals was not created on the substrate 40. A deposit of carbonaceous material was created on the substrate 40 in an area spaced from the aperture.

EXAMPLE 9

The apparatus 10 was prepared and maintained as set forth in Example 1, except that the filament bias supply 27 was adjusted to maintain the potential of the filament 20 at approximately eight volts, the grid bias supply 37 was adjusted to maintain the potential of the grid 30 at approximately negative two volts and the substrate bias supply 47 was adjusted to maintain the potential of the substrate 40 at approximately negative eighteen volts. A plate current of less than approximately negative ten picoamperes was measured. A deposit of translucent diamond crystals was not created on the substrate 40. A deposit of carbonaceous material was created on the substrate 40 in an area spaced from the aperture.

It can be seen that deposits form only under certain conditions. For example, in Examples 1 and 6, similar currents were maintained. The substrate held at a positive potential in Example 1 accumulated a thick deposit of translucant diamond crystals, while the one held just two and one-half volts below ground potential showed no deposit. Thus a negative plate potential retarded diamond growth, even though a significant current was flowing.

The diamond growth increases with the plate current when the substrate is grounded or positively charged. Examples 1 and 3 were carried out with plate currents of two hundred and eighty and 20 picoamperes, respectively. A visibly heavier deposit formed in the Example 1 at the higher current. When the plate current was completely suppressed in Example 5, no diamond deposit was formed. In reverse bias with the substrate potential less than the filament potential in Example 9, no electrons flow to the plate, but positive ions do. Under these conditions no visible deposit was observed on the substrate. Thus, by controlling the voltages of the various components, the deposition rate may be controlled.

In addition to the diamond deposit, which forms only proximate the aperture 32, an annular black carbonaceous material deposit 68, centered about the aperture 32, was always observed, whether or not diamond formed.

In the examples, no growth was observed under conditions of negative substrate bias, even when plate current was impressed. Second, no growth was observed under conditions of zero plate current, even when positive substrate bias was applied. The amount of deposit observed increases with the current through the plate. Stated in a positive sense, diamond grow&:h occurs only when both the substrate is positive or neutral, and a current of negative species flows to the substrate.

Diamond films 60 form only under conditions of positive or neutral substrate potential, and only in the presence of negative charge carriers from the filament. The annular carbon material 68, possibly graphite, forms in the region away from the aperture 32, where atomic hydrogen is sufficiently depleted A zone 61 is centered about the aperture 32 where no material 68 is deposited. The presence of this material 68 free zone 61 is an indication that the mass transport of neutral molecules is not strongly affected by the bias conditions of the apparatus 10.

In the Examples, diamond 60 forms by a mechanism involving a negatively charged species, or negative ions formed at the filament surface. Prior known proposed mechanisms do not include the existence of significant quantities of negative species or ions in the HFCVD environment. Failure to form diamond in the absence of charged species, even with a positive charge on the substrate, shows that the primary growth reaction does not proceed entirely by a free radical mechanism. The lack cf growth when the substrate is negatively charged, even in the presence of a large plate current, also indicates the growth involves more than free radicals and neutral molecules. Negative charged species likely participate in the diamond creation reaction.

It is likely that negative ions are formed at the filament via surface ionization and possible that the growth proceeds by an ionic mechanism. The potential of the growing surface could affect the growth rate by influencing a charge transfer step. Whether the important negative species is an ion, such as methyl, or an electron, the requirement that the substrate be above a specific electrical potential, and the fact that growth rate increases with current are consistent with an electrochemical reaction.

Patterns of various geometries can be shaped or patterned on the substrate, by creating a nonuniform electric field on or near the substrate surface. One means to accomplish this would be by the induction of spatially varying electric charges on the surface of the substrate. Another means would be to vary the electric field above the substrate to direct the diffusion of ions.

EXAMPLE 10

The apparatus 10 was prepared and maintained as set forth in Example 1, except that a single-wire grid 130 was used in place of the aperture grid 30. The grid bias supply 37 was adjusted to maintain the potential of the grid 130 at approximately fifteen volts and the substrate bias supply 47 was adjusted to maintain the potential of the substrate 40 at approximately five volts. A deposit of translucent diamond crystals was created uniformly across the substrate 40.

EXAMPLE 11

The apparatus 10 was prepared and maintained as set forth in Example 10, except that the grid bias supply 37 was adjusted to maintain the potential of the grid 130 at approximately negative thirty volts. A deposit of translucent diamond crystals was created on the substrate 40 away from but not proximate to the grid 130.

The pattern of the deposit indicates that active species were effectively repelled by the negatively charged wire grid, resulting in nonuniform coverage which replicates the field.

The influence of the electric field on the growth rate of diamond may be used for patterning the deposit, especially on nonmetallic substrates, which would allow large field gradients at the growth surface. A spatially varying field may be used to produce arrays of diamond mesa structures, which may facilitate semiconductor device fabrication. Alternatively, if uniform diamond coverage is desired, electric fields could be applied to enhance growth in regions where the concentration of activated species is limited. This would enable uniform coverage over large areas and complicated shapes. A further application of the electric bias is to produce high growth rates of diamond by adopting bias conditions of high current.

The above description and drawings are only illustrative of preferred embodiments which achieve the objects, features and advantages of the present invention, and it is not intended that the present invention be limited thereto. Any modification of the present invention which comes within the spirit and scope of the following claims is considered part of the present invention.

What is claimed as new and desired to be protected by Letters Patent of the United States is:

1. A method for depositing patterns of diamond on a substrate, comprising the steps of:

providing a diamond deposition apparatus having a first and a second chamber separated by a grid having a pattern which allows the passage of atoms and/or molecules between said first and second chambers;

evacuating said diamond deposition apparatus to sub-atmospheric pressure;

introducing a gas containing a diamond forming species into said first chamber said diamond deposition apparatus;

positioning a substrate in said second chamber proximate to said grid;

maintaining said substrate at a temperature suitable for diamond formation from said diamond forming species in said gas;

creating an electric field in said diamond deposition apparatus by impressing a first electrical bias on an electrode positioned in said first chamber of said diamond deposition apparatus, impressing a second electrical bias on said grid, and impressing a third electrical bias on said substrate in said second chamber of said diamond deposition apparatus; and controlling said first, second, and third electrical biases to allow activated species in said first chamber of said diamond deposition apparatus to pass from said first chamber to said second chamber and be deposited on selected regions of said substrate which reflect said pattern of said grid.

2. A method as recited in claim 1 wherein said step of introducing a gas containing a diamond forming species into said first chamber includes the steps of providing a heatable element in said first chamber of said diamond apparatus capable of dissociating a carbon compound into a charged, activated diamond forming species;

supplying a gas containing carbon compounds to said first chamber of said diamond forming apparatus; and heating said heatable element to a temperature sufficient to dissociate said carbon compounds into charged, activated diamond forming species.

3. A method as recited in claim 2 wherein said heatable element used in said step of introducing a gas containing an activated carbon containing species into said first chamber is also the electrode in said first chamber used in said step of creating an electric field in said diamond deposition apparatus.

4. A method as recited in claim 1 wherein said pattern of said grid includes at least one aperture.

5. A method as recited in claim 1 wherein said pattern of said grid is one or more rods.

6. A method as recited in claim 1 wherein said step of controlling said first, second, and third electrical biases includes the step of negatively biasing said electrode in said first chamber, biasing said grid to more positive than said electrode, and biasing said substrate more positive than said grid.

7. A method as recited in claim 1, wherein said step of evacuating said diamond deposition apparatus and said step of creating an electric field are maintained to suppress thermionic emission current to the substrate.

8. A method as recited in claim 1 wherein said gas in said introducing step includes hydrogen.

9. A method as recited in claim 1 wherein said gas in said introducing step includes methane.

10. A method as recited in claim 1 wherein said gas in said introducing step is hydrogen containing about one percent methane.

11. A method as recited in claim 1 wherein said substrate is a component of an electronic device.

12. A method as in claim 11 wherein said device is a semi-conductor device.

13. A method as in claim 11 wherein the deposit is formed on at least one region of said device to provide electrical insulation for components of said device.

14. A method as in claim 13 wherein the deposit is formed in at least one region of said device to provide thermal conductance to conduct heat away from said device.

15. A method for depositing patterned diamond on a substrate in a reduced pressure atmosphere comprising the steps of:

providing a grid with a preselected pattern;
positioning a substrate below said grid;
positioning an electrode above said grid;
creating a first electric field associated with said electrode;
creating a second electric field associated with said grid;
creating a third electric field associated with said substrate;
introducing an activated carbon containing species into said first electric field;
selectively directing said activated carbon containing species through said grid towards said substrate with said first and said second and said third electric fields, to deposit a pattern of diamond on said substrate which reflects said preselected pattern on said grid.

16. A method for depositing patterned diamond on a substrate in a reduced pressure atmosphere as in claim 15 further comprising the steps of:

creating said first electric field by impressing a first electrical bias on said electrode;
creating said second electric field by impressing a second electrical bias on said grid;
creating said third electric field by impressing a third electrical bias on said substrate.

17. A method for depositing patterned diamond on a substrate in a reduced pressure atmosphere as in claim 15 further comprising the step of:

heating said electrode to a temperature suitable to cause a carbon containing precursor gas to activate into said activated carbon containing species introduced into said first electric field during said introducing step.

18. A method for depositing patterned diamond on a substrate in a reduced pressure atmosphere as in claim 16 further comprising the step of:

varying said first, said second or said third electrical biases to control the thickness of said diamond deposited on said substrate.

19. A method for depositing patterned diamond on a substrate in a reduced pressure atmosphere as in claim 17 wherein said precursor gas is a mixture of hydrogen and methane.

20. A method for depositing patterned diamond on a substrate in a reduced pressure atmosphere as in claim 16 wherein said second electrical bias is more positive than said first electrical bias and said third electrical bias is more positive than said second electrical bias.

21. A method for depositing patterned diamond on a substrate in a reduced pressure atmosphere as in claim 20 wherein said first electrical bias is less than 0 volts, and said third electrical bias is at least 0 volts.

22. A method for depositing patterned diamond on a substrate in a reduced pressure atmosphere as in claim 15 wherein said grid has apertures extending therethrough.

23. A method for depositing patterned diamond on a substrate in a reduced pressure atmosphere as in claim 15 wherein said grid is comprised of at least one rod.

* * * * *